Jan. 10, 1967 R. M. SCHULMEYER ET AL 3,297,883
STABLE TRANSISTORIZED VARIABLE DELAY GENERATOR
Filed Dec. 31, 1963
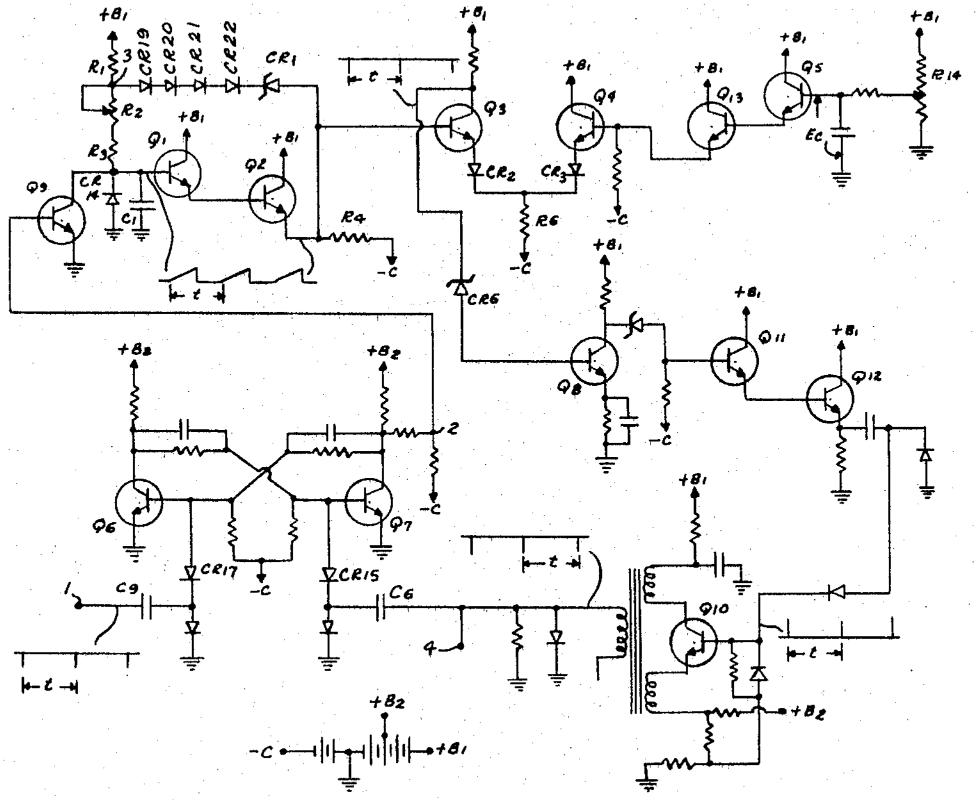
INVENTORS
C. D. GARDNER
R. M. SCHULMEYER
BY [signature]
ATTORNEY
[signature]
AGENT

3,297,883
STABLE TRANSISTORIZED VARIABLE DELAY GENERATOR

Raymond M. Schulmeyer, Baltimore, and Colin D. Gardner, Glen Burnie, Md., assignors to the United States of America as represented by the Secretary of the Air Force Filed Dec. 31, 1963, Ser. No. 334,955
1 Claim. (Cl. 307—88.5)

The purpose of this invention is to provide a transistorized circuit for producing from an incoming train of trigger pulses a corresponding outgoing train of pulses having a delay relative to the incoming pulses that is proportional to a variable control voltage. Principal objects of the invention are to provide a high degree of linearity between the delay and the control voltage, to provide a delay circuit capable of operating at duty cycles from approximately 0 to 98% and to provide a delay circuit in which the delay accuracy is maintained over a wide temperature range, for example, —29° C. to +70° C.

Briefly, the delay circuit comprises a bootstrap ramp generator in which a capacitor is charged at a constant rate to produce a voltage that linearly increases with time. The ramp is initiated at each incoming trigger pulse and is compared with the variable control voltage. When the two become equal a blocking oscillator is triggered to generate the delayed output pulse. The delayed output pulse is also utilized to discharge the capacitor in the bootstrap circuit and condition this circuit to start a new cycle of operation at the next trigger pulse. A novel feature of the bootstrap circuit is the use of a zener diode in place of the usual coupling capacitor to increase the linearity of the ramp with time. Diode and transistor temperature compensation is used at all strategic points in the circuit to maintain circuit accuracy over a wide temperature range.

The invention will be explained in more detail with reference to the schematic diagram of a specific embodiment thereof shown in the single figure of the accompanying drawing.

Referring to the drawing, negative trigger pulses having a repetition interval *t* are applied to input terminal 1 and thence through $C_9$ and $CR_{17}$ to the base of $Q_6$. $Q_6$ and $Q_7$ are connected in a bistable circuit. Prior to the application of a trigger pulse $Q_6$ is conductive and $Q_7$ is cut off. With $Q_7$ cut off, point 2 and the base of $Q_9$ are at sufficiently high potential that $Q_9$ is conductive and $C_1$ at zero charge, having previously discharged through this transistor.

The application of a negative trigger to input terminal 1 causes the bistable circuit to switch to its other state in which $Q_6$ is cut off and $Q_7$ is conductive. This lowers the base of $Q_9$ below cut off rendering this transistor nonconductive. $C_1$ now charges through $R_1$, $R_2$ and $R_3$ from $+B_1$. The potential across $C_1$ is applied to the input of a unity gain amplifier consisting of transistors $Q_1$ and $Q_2$ and load impedance $R_4$. Due to the high gain of $Q_1$–$Q_2$ the voltage across $R_4$ is substantially identical to that across $C_1$, the device acting as an emitter follower. Also, due to the high gain of $Q_1$–$Q_2$, the impedance between the base of $Q_1$ and ground is relatively high and the impedance between the emitter of $Q_2$ and ground is very low because of the total negative feedback of the output signal across $R_4$. Therefore, in effect, the unity gain amplifier is a coupling device having relatively high input impedance and low output impedance. The voltage across $R_4$ is fed back through a circuit containing zener diode $CR_1$ and temperature compensating diodes $CR_{19}$–$CR_{22}$ to point 3 between $R_1$ and $R_2$. As a result, a rise in potential across $C_1$ produces an equal rise in the potential of point 3 so that the potential across $R_2$–$R_3$ remains constant. With the potential across $R_2$–$R_3$ constant, a constant charging current flows into $C_1$ and its voltage increases linearly with time.

Bootstrap ramp circuits of the above general type are well known in the art and described in the literature, for example, on page 268 of the Radiation Laboratory Series, vol. 19, Waveforms. With vacuum tubes it is customary to use a capacitor to couple the output of the unity gain amplifier back to the charging circuit. However, such circuits are linear only to the extent that the potential across the coupling capacitor does not change during the ramp generating process. This condition can be approached in vacuum tube circuits because of the high grid-cathode impedance of vacuum tubes. In contrast to vacuum tubes, transistor emitter-base impedances are very low, which prevents the use of a coupling capacitor since it would leak charge rapidly and introduce serious nonlinearity except at the very shortest duty cycles. The voltage across a zener diode is substantially independent of the current flow through it. Therefore, the zener diode $CR_1$ in the described bootstrap circuit acts as a coupling capacitor of infinite size and maintains a constant voltage across its terminals throughout the operating cycle of the ramp generator. Therefore, the zener diode makes possible a transistorized ramp generating circuit operating at a duty cycle (ratio of ramp duration to repetition period) as high as 98%.

The ramp voltage developed across $R_4$ is applied to the base of $Q_3$. This transistor and $Q_4$ comprise a voltage comparator circuit. A control voltage to be compared with the ramp voltage is applied to the base of $Q_4$. The control voltage is variable and is derived from $R_{14}$ by way of $Q_5$ and $Q_{13}$. Assuming the ramp voltage to be zero, the emitter current of $Q_4$ flowing in $R_6$ biases the emitter-base junction of $Q_3$ beyond cut off by an amount determined by the setting of $R_{14}$. As the ramp voltage across $R_4$ increases, the base of $Q_3$ rises in potential. This continues until the emitter-base junction of $Q_3$ becomes forward biased at which instant a negative pulse is produced at the collector. This pulse is inverted and amplified by $Q_8$, $Q_{11}$ and $Q_{12}$ and applied as a positive pulse to the base of $Q_{10}$. This triggers the blocking oscillator circuit for which $Q_{10}$ is the amplifying element to produce a negative pulse in substantial coincidence with the negative pulse at the collector of $Q_3$. The blocking oscillator pulse, which appears at output terminal 4, constitutes the output pulse which has been delayed relative to the trigger pulse at terminal 1 by an amount proportional to $E_c$ as determined by the setting of $R_{14}$.

The negative output pulse is also applied by way of $C_6$ and $CR_{15}$ to the base of $Q_7$ which, as stated earlier, is now in a conductive state. This cuts $Q_7$ off and returns the bistable circuit to its initial stable state with $Q_6$ conductive and $Q_7$ nonconductive. Turning off $Q_7$ raises the potential of point 2 and the base of $Q_9$ sufficiently to produce full conduction in this transistor which rapidly discharges $C_1$ and conditions the ramp generating circuit for the next trigger pulse and a new cycle of operation.

The delay corresponding to the maximum value of control voltage $E_c$ may be adjusted, up to its maximum value of $.98t$, by adjusting $R_2$ which controls the rate at which $C_1$ charges.

Temperature compensation in the delay generator is accomplished as follows: $CR_{19}$, $CR_{20}$, $CR_{21}$ and $CR_{22}$ compensate for $Q_1$ and $Q_2$ in the bootstrap circuit. Since $Q_1$ and $Q_2$ are also factors in the voltage comparator circuit, they must also be compensated with respect to that circuit. This is accomplished by $Q_5$ and $Q_{13}$. $Q_3$ compensates for $Q_4$ in the voltage comparator circuit. $CR_2$ compensates for $CR_3$ in the voltage comparator circuit.

Finally, $CR_{14}$ compensates for $Q_9$ in the discharge circuit of $C_1$.

We claim:

A temperature compensated transistorized delay generator with high duty cycle capability for receiving a series of trigger pulses and generating for each trigger pulse received an output pulse at a delay interval thereafter that is proportional to an applied control voltage and has a value ranging from near zero to a value very close to the pulse repetition interval of said trigger pulses, said generator comprising: first and second sources of direct current each having one terminal connected to a point of reference potential, the terminals so connected being of opposite polarity; a ramp circuit comprising a capacitor having one terminal connected to said point of reference potential, first and second resistors connected in series between the other terminal of said first source and the other terminal of said capacitor, a unity gain amplifier comprising first and second transistors, the base of the first transistor being connected to the said other terminal of said capacitor, the emitter of said first transistor being connected to the base of said second transistor, and the emitter of said second transistor being connected through a load impedance to the other terminal of said second source, and a connection between the emitter of said second transistor and the junction of said first and second resistors, said connection containing in series a zener diode and a plurality of diodes in forward conduction for temperature compensating said first and second transistors with respect to said ramp circuit; a voltage comparator circuit comprising third and fourth transistors having their emitters connected through a common resistor to the said other terminal of said second source, a connection between the base of said third transistor and the emitter of said second transistor, means including fifth and sixth transistors for applying said control voltage between the base of said fourth transistor and the said other terminal of said second source, said fifth and sixth transistors being connected like said first and second transistors and serving to temperature compensate said first and second transistors with respect to said voltage comparator; a seventh transistor having its collector-emitter path connected in shunt to said capacitor; a bistable circuit coupled to said seventh transistor for controlling its conductivity, said seventh transistor being fully conductive in one of the stable states of said bistable circuit and nonconductive in the other stable state; means for applying said trigger pulses to said bistable circuit for switching it from its said one state to said other state; and means responsive to an output from said third transistor for switching said bistable circuit from said other state back to said one state.

References Cited by the Examiner

UNITED STATES PATENTS

| | | | |
|---|---|---|---|
| 2,933,623 | 4/1960 | Jones et al. | 307—88.5 |
| 2,998,532 | 8/1961 | Smeltzer | 307—88.5 |
| 3,177,375 | 4/1965 | Hakomoglu et al. | 307—88.5 |
| 3,202,937 | 8/1965 | Anderson | 331—111 |

OTHER REFERENCES

Publication: "Design Concepts of a High-Brightness Airborne Radar Indicator," by Koenig in Electrical Communication, vol. 36, No. 2, 1960 (reprint of article of October 1958), FIG. 7 and pages 135 and 136 relied upon.

ARTHUR GAUSS, *Primary Examiner.*

S. D. MILLER, *Assistant Examiner.*